United States Patent [19]
Dauge et al.

[11] 4,187,460
[45] Feb. 5, 1980

[54] CAPACITANCE MEASURING BY COMPARISON TO REFERENCE CAPACITANCE

[75] Inventors: Gilbert V. Dauge, Lagny; Jacques F. Langlais, Coudray Montceaux, both of France

[73] Assignee: Testut Aequitas, Paris, France

[21] Appl. No.: 945,413

[22] Filed: Sep. 25, 1978

[30] Foreign Application Priority Data

Sep. 23, 1978 [FR] France .................. 77 28758
Sep. 13, 1978 [FR] France .................. 78 26295

[51] Int. Cl.² ........................................... G01R 27/26
[52] U.S. Cl. ........................... 324/60 CD; 324/60 C
[58] Field of Search ............. 324/60 R, 60 CD, 60 C

[56] References Cited

U.S. PATENT DOCUMENTS

| 3,824,459 | 7/1974 | Uchida | 324/60 CD |
|---|---|---|---|
| 4,039,940 | 8/1977 | Butler et al. | 324/60 C |

FOREIGN PATENT DOCUMENTS

2254779 11/1975 France .................. 324/60 C

*Primary Examiner*—James B. Mullins
*Assistant Examiner*—Ernest F. Karlsen
*Attorney, Agent, or Firm*—Abraham A. Saffitz

[57] ABSTRACT

Capacitance measuring device for measuring a physical quantity proportional or inversely proportional to the capacitance X of a first capacitor. A oscillating circuit includes a second capacitor having a reference capacitance $X_E$ or the first capacitor during successive reference and measuring phases under control switching network respectively. A counter counts a predetermined oscillation pulse number $N_E$ during the reference phase and a oscillation pulse number $N_X$ during the measuring phase. The duration of two phases are equal or in a predetermined ratio R by means of a counter-down-counter which counts and down-counts the same number of clock pulses at least a predetermined frequency. The change of the counting to down-counting condition is controlled by the counter when its count is equal to $N_E$. The stopping of the counter is controlled by the counter-down-counter when its count is equal to zero at the end of the measuring phase. A displaying and computing unit computes the physical quantity in dependence on the capacitance value $X = (N_E X_E)/(R N_X)$ which is not affected by the drifts of device components and interference capacitances.

10 Claims, 8 Drawing Figures

4,187,460

CAPACITANCE MEASURING BY COMPARISON TO REFERENCE CAPACITANCE

BACKGROUND OF THE INVENTION

1. Field of the Invention

This invention relates to a capacitance measuring device for measuring the capacitance of a capacitor to be measured with respect to the calibrated reference capacitance of a capacitor by means of the comparison of the charge and discharge periods of said capacitors during two successive measuring and reference phases of a comparison cycle. In particular, this invention concerns measurements of a physical quantity such as a displacement or a pressure generated from a capacitive sensor in which a variation of the physical quantity is converted into a capacitance variation.

2. Description of the Prior Art

Devices of the aforementioned type have been made to compare the capacitances of a capacitor to be measured and a reference capacitor. For example, the French patent application No. PV 73 45271 filed on Dec. 18, 1973 in the name of "Société nouvelle de roulements" (S.N.R.) discloses a capacitance measuring device which is analogous to a zero-beat indicator. Such device comprises a counter for counting oscillation pulses delivered by an oscillating circuit which includes the reference capacitor or the capacitor to be measured during the reference phase or the measuring phase, and a counter-down-counter which counts and down-counts clock pulses at a predetermined frequency during each comparison cycle.

The count of the counter is equal to its predetermined maximum count n at the end of each of the successive reference and measuring phases. The zero-setting of the counter is automatically controlled at the end of each of the phases. In this way, the durations of the reference and measuring phases of a comparison cycle are different and are equal to $\Delta t_E = nT_E$ and $\Delta t_X = nT_X$ respectively, since the periods $T_E$ and $T_X$ of pulses delivered from the oscillating circuit are different therebetween and proportional to the capacitances of the reference capacitor and the capacitor to be measured respectively.

During the reference phase, the counter and the counter-down-counter count the oscillation pulses at the frequency $F_E = 1/T_E$ and the clock pulses respectively. When the count of the counter is equal to n at the end of the reference phase, it controls the change of the counting condition to the down-counting condition of the counter-down-counter. Consequently, the counter-down-counter counts and down-counts a same predetermined clock pulse number during a time T' equal to $2\Delta t_E$.

In this capacitance measuring device, the counter and the counter—down-counter deliver two pulses of respective durations $T = \Delta t_E + \Delta t_X = n(T_E + T_X)$ and $T' = 2\Delta t_E$ during each comparison cycle. The phase shift (T−T') is calculated in a phase comparison circuit so as to deduce the difference between the capacitances $X_E, X$ of the reference capacitor and the capacitor to be measured; the measuring device thus is analogous to a zero indicator.

As a result, measurement of the capacitance is affected by drifts in the oscillating circuit and interference capacitances especially between the capacitor electrodes and the ground referenced voltage, since the difference (T−T') is directly proportional to a factor K representing these drifts and interferences $$T-T'=nK(X_E+X)-2nKX_E$$

or $$T-T'=nK(X-X_E)$$

OBJECTS OF THE INVENTION

Accordingly, an object of this invention is to provide a capacitance measuring device directly indicating the physical quantity to be measured which is proportional or inversely proportional to the capacitance of the capacitor to be measured.

It is another object of this invention to provide a device for measuring the capacitance of a capacitor with a great accuracy.

It a further object of this invention to provide a capacitance measuring device where the measurement of the capacitance or the physical quantity to be measured is not affected by the interference capacities between the electrodes of the capacitor or the sensor and the ground referenced voltage.

It is still another object of this invention to provide a capacitance measuring device in which the measurement of the capacitance or the physical quantity to be measured is not affected by feature variations of the component circuits of the device such as feature variations in function of the temperature.

SUMMARY OF THE INVENTION

In accordance with the aforementioned objects, there is provided a capacitance measuring device for measuring the capacitance X of a first capacitor by means of the comparison of the charge and discharge periods of a second capacitor having a calibrated reference capacitance $X_E$ and said first capacitor during two successive reference and measuring phases of a comparison cycle, said device comprising:

an oscillating circuit including one of said first and second capacitors and having an oscillation period proportional to the capacitance of said included capacitor and a high stability;

switching means for including at the beginning of each of said reference and measuring phases said second and first capacitors in said oscillating circuit respectively;

means for counting a predetermined number $N_E$ of pulses delivered from said oscillating circuit during said reference phase so as to define a determined duration of said reference phase and for counting a number $N_X$ of pulses delivered from said oscillating circuit during said measuring phase, the ratio of said oscillation pulse numbers $N_E$ and $N_X$ being inversely proportional to the ratio of said capacitances $X_E, X$ of said second and first capacitors;

timing means for generating pulses having at least a clock frequency;

means for counting and down-counting said clock pulses during said reference and measuring phases respectively;

means controlled by said counting means for changing the counting condition to the down-counting condition of said counting and down-counting means when the count of said counting means is equal to said predetermined number $N_E$ at the end of said reference phase;

means controlled by said counting and down-counting means for stopping the counting of said counting means when the count of said counting and down-counting means is equal to zero at the end of said measuring phase so that the duration of said measuring phase is equal to or in a predetermined ratio R with said determined duration of said reference phase;

means for computing a physical quantity proportional or inversely proportional to the value $(N_E X_E)/(R N_X)$ equal to said capacitance X of said first capacitor; and means for displaying the value of said physical quantity.

It would therefore appear to some advantage, in contrast to the aforementioned French patent application No PV 73 45271, that the capacitance measuring device embodying the invention make no difference in durations corresponding to a predetermined number of pulses from the oscillating circuit, but only make a ratio of two oscillation pulse numbers $N_E, N_X$ during the successive reference and measuring phases which are in a predetermined ratio R, so that the calculation inherent in the number ratio implicitely cuts out the effect of the interference created notably by the oscillating circuit. Thus, for a reference capacitor having a predetermined capacitance $X_E$ and for a predetermined ratio R, the product of $X_E$ and the pulse number ratio $(N_E/N_X)$ gives the value of the capacitance X of the capacitor to be measured directly. In addition to this, for example, the clock of the timing means generating the pulses counted and down-counted by the counting and down-counting means does not need to have a high stability since a capacitance ratio which cuts out all the slow-variation interference effects of the components making up the capacitance measuring device is being assumed. The clock can therefore be such as a single multivibrator circuit.

Generally speaking, a capacitor of capacitance X included in the oscillating circuit such as a relaxation oscillator having a high stability is discharged and charged depending on a first polarity of its electrodes during the first alternation of the relaxation oscillation period $T_X = 1/F_X$ and is discharged and charged depending on a second polarity opposite to the first one during the second alternation of the period $T_X$ between two predetermined voltages $V_1$ and $V_2$ by means of a stabilized voltage supply E and through the predetemined resistor of the relaxation oscillator. The frequency $F_X$ produced by the relaxation oscillating circuit is of the form:

$$F_X = f(V_1, V_2, E)/(RX) \quad (1)$$

where f is inversely proportional to a well known logarithmic function dependent on the extreme voltages $V_1$ and $V_2$ and the supply voltage E.

If the voltages $V_1$ and $V_2$ and, by extension, the supply voltage E, and the resistance R are assumed stable over a comparison cycle, then equation (1) is equivalent to the following:

$$F_X = 1/(K \cdot X) \quad (2)$$

where K is the constant referred to above.

According to this invention, the measurement comes down to count the pulses delivered by the oscillating circuit and to obtain the numbers of relaxation oscillation periods $N_E$ and $N_X$ alternately when the reference capacitor of known capacitance $X_E$ is inserted in the oscillating circuit and when the capacitor of capacitance X to be measured is inserted in the oscillating circuit during the successive reference and measuring phases respectively. These phases have predetermined durations of equal preference and decidedly longer than the relaxation oscillation periods corresponding to the range of capacitances to be measured. In this connection, the capacitance $X_E$ of the reference capacitor may be chosen equal to one of the limits of the capacitance range which corresponds to the zero of the measuring indicator of the computing means and to the maximum or minimum frequency $F_E = 1/(KX_E)$ of the pulses delivered by the oscillating circuit during a comparison cycle.

According to a first embodiment, the capacitor of capacitance X to be measured is made up of, for example, two coaxial cylindrical electrodes, one of which is coaxially movable with respect to the other. The variation of the physical quantity $G_X$ to be measured is proportional to that of the surface area of the capacitor. If $C_m$ designates the capacitance value indicated by the device, and $C_i$ designates the total interference capacitance which is usually taken with respect to the ground referenced voltage of the device, then the following relations are obtained:

$$C_m = X + C_i \quad (3)$$

and $$G_X = AC_i + B = AX + AC_i + B$$

where A and B are constant.

By calling $G_E$ the analog quantity corresponding to the capacitance $C_E$ indicated in reality and representative of the reference capacitance $X_E$, then it seems according to the following double relation:

$$G_X - G_E = A(C_m - C_E) = A(X - X_E)$$

that the linearity of the measurement is conserved regardless of the interference capacitance $C_i$.

In accordance with this first embodiment, the counts $N_E, N_X$ of the oscillating pulses counted by the counting means during the reference phase and the measuring phase of each comparison cycle are respectively predetermined and inversely proportional to the physical quantity to be measured.

According to a second embodiment, the capacitor of capacitance X to be measured has flat electrodes which are spaced of a distance d varying proportionally to the physical quantity $G_X$ to be measured. Consequently, in constrast to the first embodiment, the capacitance X is inversely proportional to the physical quantity $G_X$ and is given by the following relation:

$$X = A'/d \sim 1/G_X \quad (4)$$

where A' is a constant dependent on the surface areas of the electrodes and the relative permittivity of the dielectric medium between the electrodes.

By writing the total interference capacity $C_i$ in the following form:

$$C_i = A'/e \quad (5)$$

where e is a length defining Cp which is very large compared to the maximum value $d_E$ of d corresponding preferably to the reference or minimum value $X_E$ of the range of capacitance to be measured, we have according to relations (2) to (5):

$$C_m = A'(1/d + 1/e)$$

or $$F_m = 1/(KC_m) = (1/(KA'))\cdot(d/(1+d/e))$$

where $F_m$ represents the oscillation frequency corresponding to the value of capacitance $C_m$. Thus according to this second embodiment a d/e term present in the denominator of the above relation bestows a non-linear variation on the indicated value of the capacitance X in terms of the physical quantity $G_X$ and consequently a linearity error on the capacitance measurements.

In this end, the oscillating means includes means for neutralizing the reference capacitor and the capacitor to be measured during the measuring and reference phases respectively or for inhibiting the effects of the interference capacitances between the ground referenced potential and the electrodes of the capacitors.

BRIEF DESCRIPTION OF THE DRAWING

Other objects and advantages of this invention will be apparent from the following description of the preferred embodiments of the invention as illustrated in the accompanying drawings in which.

DESCRIPTION OF THE PREFERRED EMBODIMENTS

Figure 1:
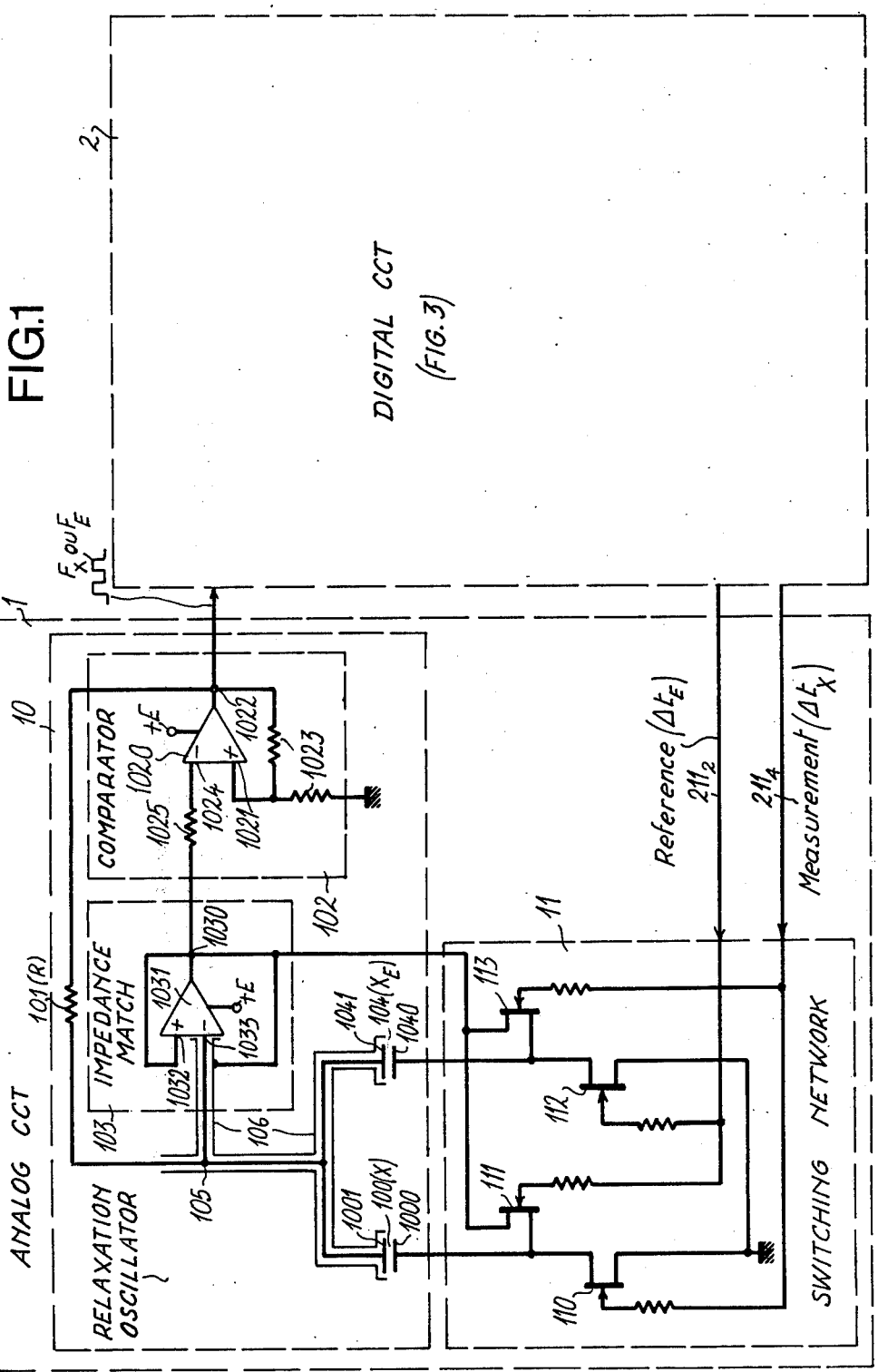
FIG. 1 is a block diagram of the capacitance measuring device in which the analog circuit is detailed in accordance with a first embodiment.

In reference to FIG. 1, the analog circuit 1 of the capacitance measuring device embodying the invention includes a relaxation oscillator 10 acting as a voltage-frequency converter and a switching network 11 making it possible, as shown in the arrangement of FIG. 1, to connect reference or calibrating capacitor 104 and measuring capacitor 100 under the control of the digital circuit 2 to the ground referenced voltage alternately. Except where otherwise indicated, all signals are referenced to ground.

All stated, the invention is not concerned with the choice of the parameter d or S, namely the distance between the electrodes or the surface area of the electrodes of the measuring capacitor, but merely with the capacitance which is representative of the physical quantity $G_X$ to be measured.

During the measuring phase, the capacitor 100 of capacitance X has—as will be seen later on—a first electrode 1000 connected to the reference voltage whereas its second electrode 1001 is permanently connected to the output terminal 1022 of a voltage comparator 102 via a resistor 101 of a high ohmic resistance R. The direct input 1021 of the operational amplifier 1020 of the comparator 102 is connected to its output terminal 1022 through a voltage divider bridge 1023 determining a voltage $v_0$ whereas its inverse output 1024 is connected to the output 1030 of an impedance matching circuit 103 via a resistor 1025.

This circuit 103 is made up of an operational amplifier 1031 which has an internal gain equal to unity. Its output terminal 1030 is connected to the direct input 1032 and its inverse input 1033 is connected to the second electrode 1001 of the measuring capacitor 100. The input impedance of the amplifier 1031 is very high so as not to influence the charging and discharging of the capacitor 100 by through the resistor 101 whereas the output impedance of the amplifier 1031 is, on the other hand, very small so as to ensure, in accordance with this first embodiment, a neutralization (Neutrody ne principle) of the coaxial conductor which screens the connection 105 common to the resistor 101, the inverse input 1033 and the second electrodes 1001 and 1041 of the capacitor 100 to be measured and the reference capacitor 104 respectively.

The operation of the relaxation oscillator 10 is described below in reference to the timing diagram of FIG. 2.

When the capacitance measuring device supply voltage E is applied, the capacitor 100 charges up according to a first polarity to the point where the second electrode 1001 is at a voltage $V_0$ corresponding to the predetermined voltage $+v_0$. The voltage at the output terminal 1022 of the comparator 102 previously at the supply voltage $+E$ is carried to the voltage $-E$ which causes a second polarity inverse to the previous one at the terminals of the capacitor 100 which discharges and charges. When the voltage of the inverse input 1024 of the operational amplifier 1020 reaches the value $-v_0$ corresponding to the voltage $-V_0$ applied to the electrode 1001, then the voltage of the output terminal 1022 reverts to its initial value $+E$ which leads to a discharging and a charging up to the voltage $+V_0$ of the capacitor 100 according to the initial polarity.

Throughout each of the successive positive and negative polarities, the capacitor 100 discharged itself but charged itself between the voltages $(-V_0, +V_0)$ or $(+V_0, -V_0)$ during an alternative duration $1/(2F_X)$ proportional to its capacitance X which defines the oscillation frequency $F_X$ such as:

$$F_X = 1/(2(RX \ln((E-V_0)/(E+V_0)))$$

or $$F_X = 1/KX \quad (6)$$

Figure 2:
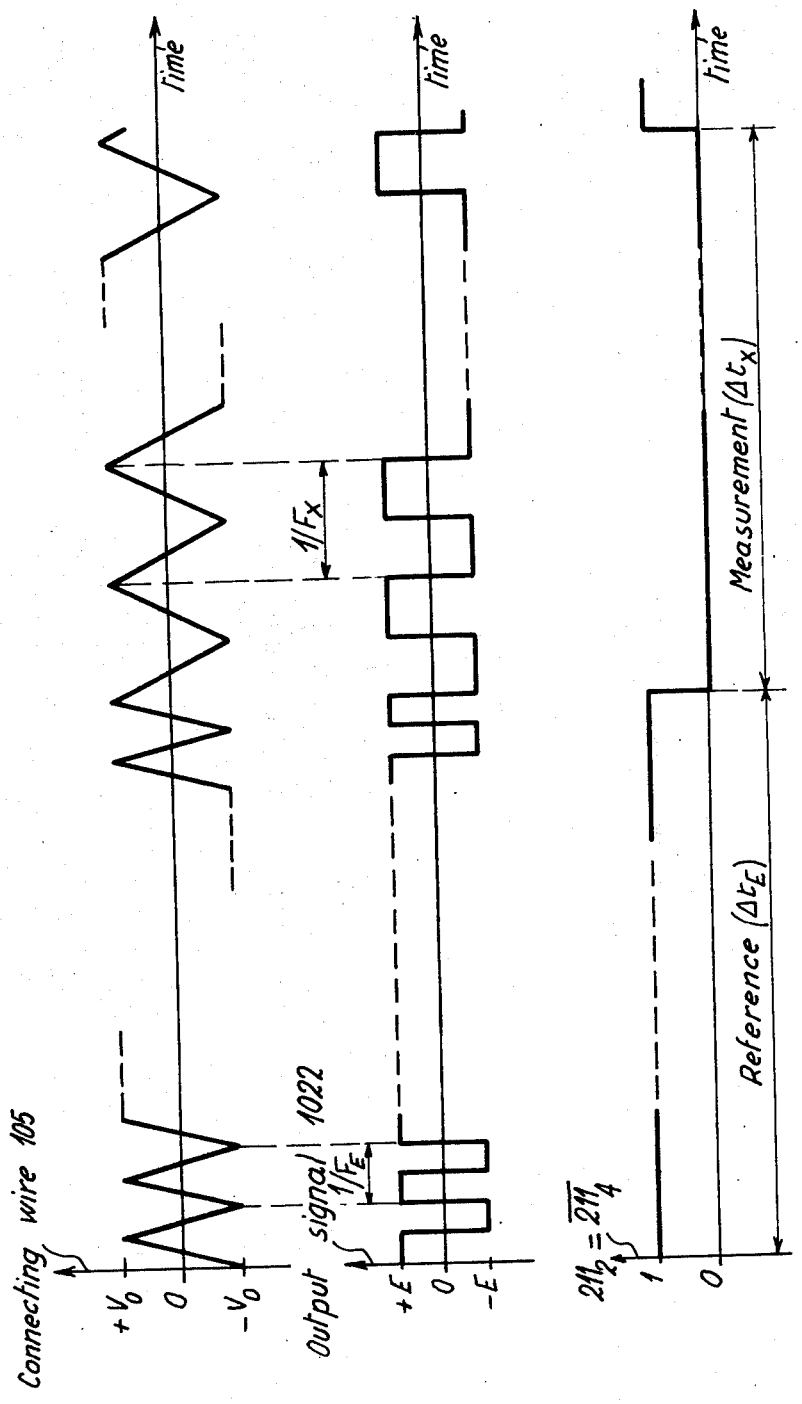
FIG. 2 is a draft showing, as a function of time, the pulse signals and the switching signals delivered by the analog and digital circuits of the device.

The first line of FIG. 2 shows the form of the triangular, symmetrical and alternating signal at the connection point 105. The second line of FIG. 2 shows the rectangular and alternating signal or pulses of period $1/F_X$ at the output terminal 1022 of the comparator 102.

This latter rectangular signal composed of pulses at the repetition frequency $F_X$ is delivered by the relaxation oscillator 10 to the digital circuit 2 which deduces the value of the capacitance X from their counting over a measuring phase $\Delta t_X$.

The influence of slow variations in the components making up the relaxation oscillating circuit 10 is represented by the constant of value K in the relation (6) which is eliminated, at the end of a comparison cycle, in the calculation of the ratio of the pulse numbers $N_E$ and $N_X$ delivered by the oscillator 10 during the reference and measuring phases of $\Delta t_E$ and $\Delta t_X$ durations respectively. The capacitors 100 and 104, connected for example in parallel by switching as shown in FIG. 1, are subject to the same outside effects such as temperature for instance.

As per this latter example, if the capacitances X and $X_E$ drift in temperature $\theta$ according to the same function $f(\theta)$ such that:

$$X_\theta = X_0(1+f(\theta)) \text{ and } X_{E\theta} = X_{E0}(1+f(\theta))$$

where $X_\theta$, $X_0$ and $X_{E\theta}$, $X_{E0}$ represent the values of capacitances X and $X_E$ at the room temperature $\theta$ when measuring and the absolute temperature, then the ratio $X/X_E$ or the ratio $F_X/F_E$ is independent of temperature.

The relaxation oscillator 10 is also linked, as shown in FIG. 1, to the reference capacitor 104 whose calibrated capacitance $X_E$ is equal to the minimum or maximum value of the range of capacitances X to be measured and whose the second electrode 1041 is connected to common connection point 105.

Over each of the two phases of the comparison cycle of the pulse numbers $N_E$ and $N_X$, which have equal durations $\Delta t_E = \Delta t_X$ as described above, one of the capacitors 100 and 104 is connected to the reference voltage whilst the other is neutralized via switching network 11 and under the control of the digital circuit 2 which delivers complementary logic signals on the two output wires $211_2$ and $211_4$ as will be explained later on in reference to FIG. 3.

In this respect, the switching network 11 joins two switches 110-111 or 112-113 of the field-effect two-transistor type to the first electrode 1000 or 1040 of each capacitor 100 or 104. A first transistor 110 turns on when its control electrode receives the respective measuring-phase signal of duration $\Delta t_X$ so as to connect the first electrode 1000 of the measuring capacitor 100 to the reference voltage, the second associated transistor 111 turning off. During this measuring phase $\Delta t_X$, the other first transistor 112 turns off and the second associated transistor 113 is energized in such a way as to neutralize the reference capacitor 104. Throughout the so called reference phase of duration $\Delta t_E$, the states of the above transistors 110 through 113 are respectively reversed and the measuring capacitor 100 is neutralized whilst the first electrode 1040 of capacitor 104 is connected to the reference voltage.

As shown in FIG. 1, the neutralizing means embodying the invention is controlled by the second transistors 111 and 113 which have their collectors connected to the output terminal 1030 of the impedance matching circuit 103 and their emitters connected to the first electrodes 1000 and 1040 of the capacitors 100 and 104 and to the collectors of the first transistors 110 and 112 respectively. Moreover, this neutralization is achieved by means of a common screening conductor 106 which is coaxial to the wires represented by the common connection point 105 and also surrounds the second electrodes 1001 and 1041 of the capacitors. This screening conductor 106 is connectdd to the output terminal 1030 of the amplifier 1031. As a result, regardless of which of the two capacitors 100 and 104 is connected to the reference voltage and consequently is undergoing charge-discharge during a phase of the comparison cycle, the two electrodes ot the other capacitor together with the screening conductor 106 are brought to a voltage whose variation follows that of the voltage of the second electrode of the capacitor undergoing charge-discharge exactly. It naturally follows from this that the effect of the total interference capacities $C_i$ relative to each capacitor is eliminated.

Figure 3:
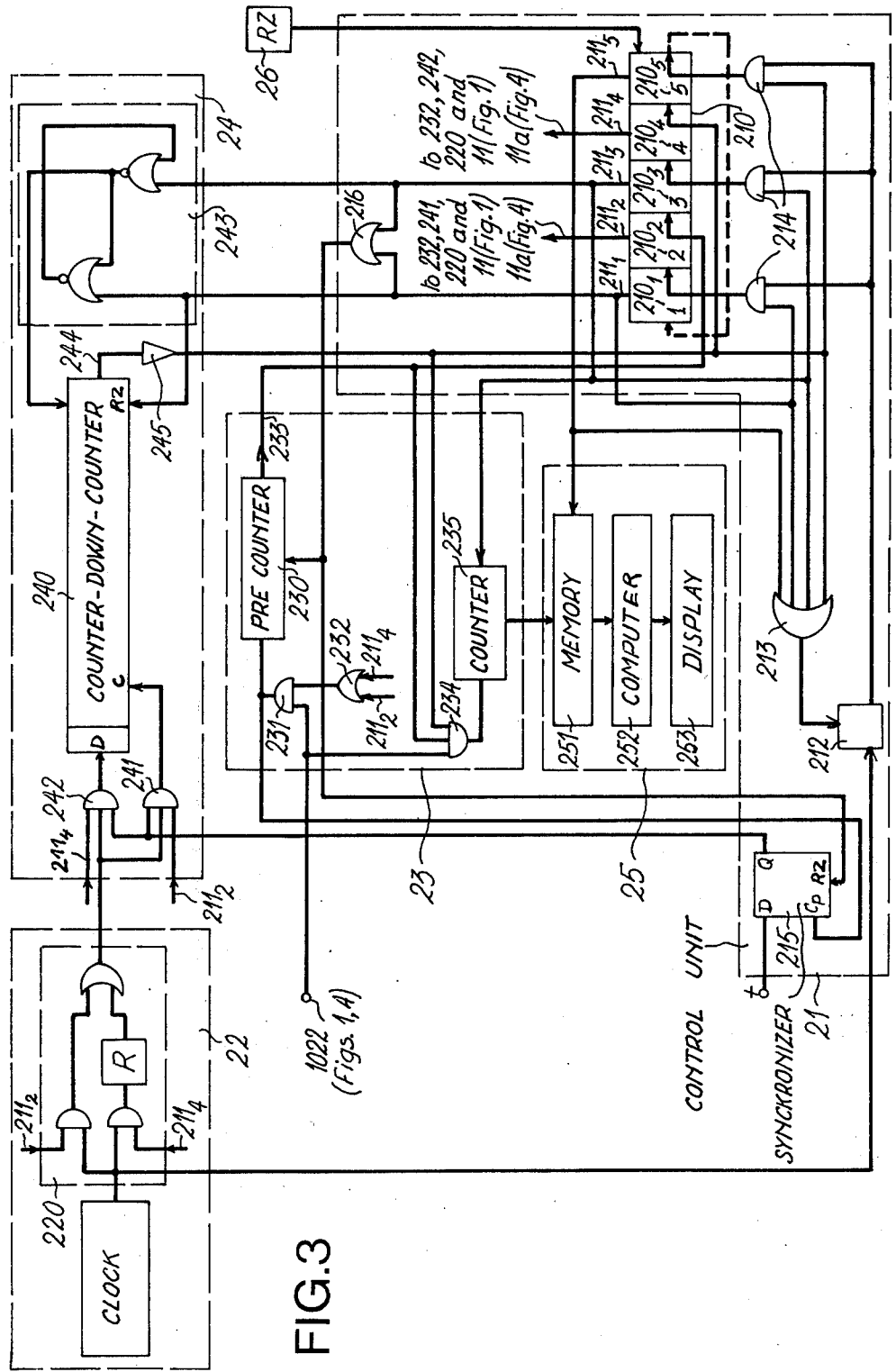
FIG. 3 is a functional block diagram of the digital circuit.

FIG. 3 shows an embodiment of the digital circuit 2 which counts the numbers of pulses $N_E$ and $N_X$ delivered from the output terminal 1022 of the analog circuit 1 during one comparison cycle.

Referring to FIGS. 2 and 3, the digital circuit 2 basically comprises:

a control unit 21 performing initializing operations of the five steps in a comparison cycle;

a clock 22 of the multivibrator type emitting clock pulses at a frequency decidedly lower than that delivered from the relaxation oscillator 10;

a counting circuit 23 which counts a predetermined number $N_E$ of pulses produced by the oscillator 10 over each reference phase and which consequently determines the duration $\Delta t_E$ of the reference phase;

a counting-down-counting circuit 24 which determines the duration of the measuring phase $\Delta t_X$ exactly equal to or, possibly, in a predetermined ratio $R = \Delta t_E / \Delta t_X$ with the duration of the reference phase $\Delta t_E$;

a computation and display unit 25 performing the direct calculation and display of the value of the capacitance X of the capacitor 104 to be measured in function of predetermined pulse number $N_E$ and the predetermined ratio R and the number $N_X$ of pulses which are produced by the relaxation oscillating circuit 10 and counted by the counting circuit 12 over the measuring phase $\Delta t_X$; the capacitance value X is then deduced from the following relations:

$$\Delta t_E = R \Delta t_X$$

or $$N_E / F_E = R N_X / F_X$$

or $$N_E K X_E = R N_X K X$$

or $$X = (X_E \cdot N_E)/(R \cdot N_X)$$

Of course, depending on whether the physical quantity $G_X$ to be measured is directly or inversely proportional to the capacitance X, the unit 25 will calculate and display the value X or 1/X or a quantity proportional to one of these two values.

Described below are the five steps of a comparison cycle, reference being made to FIG. 3 showing the digital circuit 2 in detail.

(1) When starting measuring, energizing of the capacitance measuring device controls the zero-setting of the five stages $210_1$ to $210_5$ of a shift-register 210 of the control unit 21 by means of a zero setting circuit 26. The flip-flop of the first stage $210_1$ passes to state one and controls via wire $211_1$ the zero-setting of counter-down-counter 240 of the counting-down-counting circuit 24 and the zero setting of a first counter 230 called "pre-counter" of the counting circuit 23. This zero-setting operation places the counter-down-counter 240 in the counting operation and energizes via an OR-gate 213 a monostable flip-flop 212 which is connected to the output terminal of the clock 22. Consequently, monostable flip-flop 210 controls via a set of three AND-gates 214, an one-step advance in the shift-register 210, the second flip-flop $210_2$ of which passes to the state one.

(2) The flip-flop $210_2$ initializes the second step of the comparison cycle by controlling the start of the reference phase $\Delta t_E$ via the wire $211_2$. As already stated, the transistor 111 and 112 turn on whereas transistors 110 and 113 turn off so that the capacitor 104 having the calibrated capacitance $X_E$ is measured. Under these conditions, the output terminal 1022 of the relaxation oscillator 10 transmits pulses at the frequency $F_E = 1/KX_E$ to the pre-counter 230 via an AND-gate 231 which had already been opened by an OR-gate 232 under the control of the flip-flop $210_2$. Simultaneous with the opening of the AND-gate 231 the opening of the AND-gate 241, which is connected to the counting input of the counter-down-counter 240, enables the clock pulses over the reference phase $\Delta t_E$ to be counted in the latter. This simultaneousness is ensured by a D bistable latch flip-flop 215 whose clockinput is connected to the output of the AND-gate 231 and whose output Q is connected to one of the inputs of each of the AND-gates 241 and 242. The counting and down-counting inputs of the counter-down-counter 240 are connected to the output of the AND-gates 241 and 242 respectively.

Over the reference phase the pre-counter 230 counts $N_E$ pulses at the frequency $F_E$ and the counter-down-counter 240 counts the clock pulses up to the point where the count of the pre-counter 230 is equal to its maximum count $N_E$. This instant determines the end of the reference phase of duration such that:

$$\Delta t_E = N_E / F_E$$

The output wire 233 of the pre-counter 230 passes to state one and controls the one-step advance of the shift-register 210 and via an AND-gate 234 the zero-setting of the counter 235 of the counting circuit 23.

(3) During the third step of the comparison cycle the third flip-flop $210_3$ of the shift-register 210 is in the one state and controls from the wire $211_3$:
- the latch of the AND-gate 240 in order to stop the counting function of counter-down-counter 240;
- via two NOR-gates circuit 243, the reverse of the counting-down-counting control input of the counter-down-counter 240 so as to put the latter in the down-counting condition;
- via OR-gate 216, the zero-setting of the pre-counter 230 and the synchronizing flip-flop 215; and
- energizing the monostable flip-flop 212 so that this latter controls, one the above operations have been carried out, the one-step advance of the shift-register 210.

(4) The measuring phase is then initialized from the four flip-flop $210_4$ switching to the state one. As stated, the complementary signals on the wires $211_2$ and $211_4$ being inversed with respect to the reference phase, the first electrode 1000 of the capacitor 100 to be measured is grounded across the turned-on transistor 110 whilst the reference capacitor 104 is neutralized across the turned-on transistor 113.

The output terminal 1022 of the relaxation oscillator 10 transmits, via the AND-gate 231, pulses at the frequency $F_X = 1/KX$ and the counter-down-counter 240 simultaneously down-counts the clock pulses. When the pre-counter 230 reaches its maximum count $N_E$, it triggers off the counting of pulses of frequency $F_X$ in the counter 235 via the AND-gate 234. The time elapsed as from this instant is less than $\Delta t_E = \Delta t_X$ when, for example, the capacitance $X_E$ is chosen equal to the maximum value of the capacitances X to be measured. Indeed, as the frequency $F_E$ is less than the frequencies $F_X$, the count of the pre-counter 230 is equal to its maximum count before the count in the counter-down-counter 240 is equal to zero. As a result, the counter 235 has recorded a number p of pulses at the frequency $F_X$, such that:

$$p = N_X - N_E$$

whilst the counter-down-counter is at zero. Under these conditions, the counter-down-counter 240 controls the counting stoppage in the counter 235 by means of a closing pulse emission on the wire 244 to the AND-gate 234 via an inverter 245. This closing pulse emission also triggers off the monostable flip-flop 212 via the OR-gate 213 so that the shift-register 210 advances by one step corresponding to the following and final step of the comparison cycle.

(5) At this so called transfer and computation step, the fifth flip-flop $210_5$ of the shift-register 210 has its output $211_5$ in the state one, which causes the contents of counter 235, equal to p, to be transferred into a memory 251 of the computation and display unit 25. The calculation of the ratio:

$$X = N_E X_E / N_X = N_E X_E / (N_E + p) \text{ or of } 1/X$$

directly indicates the real of inverse value of the capacitance of the capacitor 100 to be measured, the coefficient K being implicitly eliminated. This calculation is performed in a logic circuit 252 which contains a memory in which the values $N_E$ and $X_E$ have been writed-in. This memory enables to select the value $X_E$ when the measuring range is also midified. The calculation result X is then displayed in a display unit 253 at the end of the comparison cycle.

Simultaneously, on the order of computation and display unit 25, the tripping of the monostable flip-flop 212 causes the following comparison cycle to go back to the first step by putting the output wire $211_1$ of the first flip-flop $210_1$ to the state one.

Although the digital circuit has been described in accordance with a preferred embodiment, other blocks diagrams of the digital circuit come within the scope of the inventiofn and are chosen in function of the values of the range of capacitances to be measured and of the calibrated reference capacitance. In this way, if the reference capacitance is the lower limit of the capacitances to be measured, then the pulses delivered by the relaxation oscillating means over the reference phase $\Delta t_E$ are counted by a pre-counter having a maximum count $p_1$ and a counter having a maximum count $p_2$ in series, so that successively they reach their maximum additional count $N_E = p_1 + p_2$. On the other hand, during the measuring phase, only the pre-counter reaches its maximum count $p_1$ whereas the counter has its count equal to $p'$ lower than its maximum count $p_2$ at the end of the measuring phase $\Delta t_X$ such that:

$$p'=N_X-p_1$$

The value of the capacitance X to be measured or its inverse is deduced from the following equation:

$$(p'+p_1)X=(p_1+p_2)X_E=N_E X_E$$

Finally, when the reference capacitance $X_E$ has not a value lying within the range of capacitances to be measured, it is necessary to include a frequency divider or multiplier circuit 220 at the output terminal of the clock 22 during one of the reference and measuring phases, as shown in FIG. 3. If, for example, the capacitance $X_E$ is considerably larger than the range of capacitances X to be measured, then the duration $\Delta t_E$ of the reference phase is longer than the measuring phase $\Delta t_X$ but chosen in a predetermined ratio $R=\Delta t_E \Delta t_X$. In this case, in accordance with the embodiment of FIG. 3, the counter down-counter 240 counts pulses at a first clock frequency during the reference phase and down-counts pulses at a second clock frequency during the measuring phase, the second clock frequency being in the ratio R with the first clock frequency. Furthermore, the operation of the precounter 230 and counter 235 is not changed. In this case, the value of X is given by the following equation:

$$X=N_E X_E/(R(N_E+p))$$

the value of the ratio R being stored in the memory of the logic circuit 252.

It will be noted that other known parameters can be introduced into the computation unit 25 so as to directly display the physical quantity $G_X$ to be measured.

Figure 4:
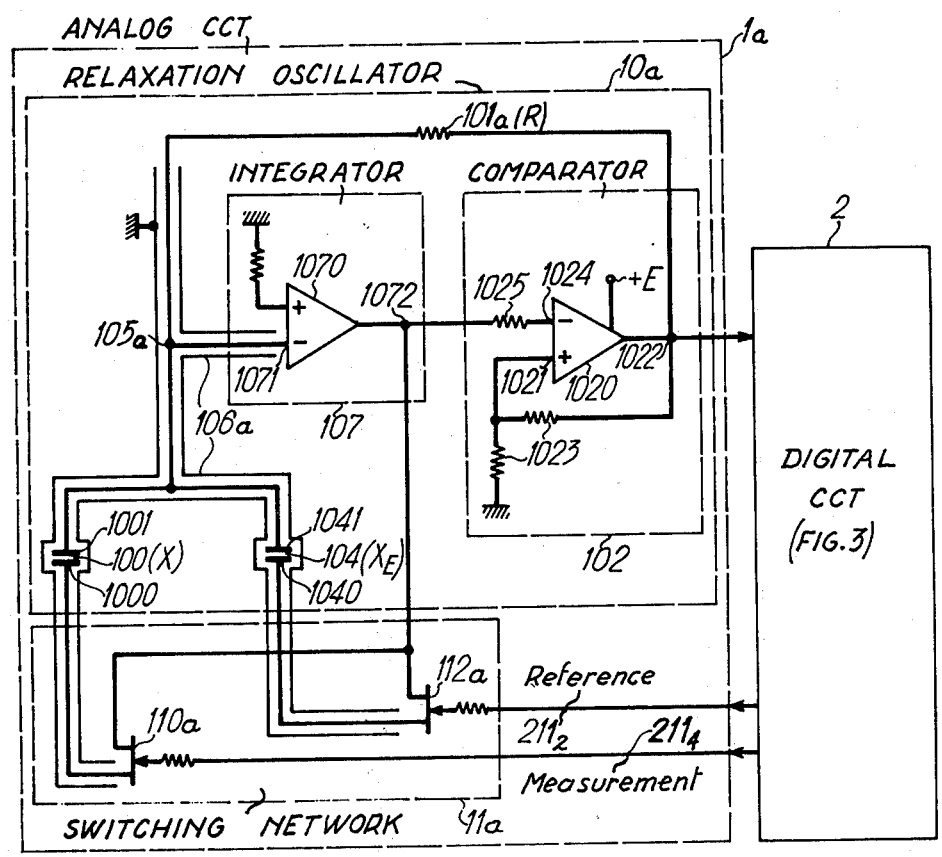
FIG. 4 is a block diagram of the capacitance measuring device in which the analog circuit is detailed in accordance with a second embodiment.

A second embodiment of the analog circuit 1a is now going to be described, in reference to FIG. 4. This analog circuit 1a enables to eliminate the interference capacitances, as in the neutralizing circuit 106-103 of FIG. 1, but presenting a very low cost and a higher degree of measuring accuracy. The index a is used to indicate those modified components of FIG. 4 which have already been presented in reference to FIG. 1.

Referring to FIG. 4, the capacitance measuring device includes a relaxation oscillator 10a and a switching circuit 11a in the analog circuit 1a and the digital circuit 2. The digital circuit 2 is not shown in detail since it is identical to that described in reference to FIG. 3.

The relaxation oscillator 10a is analogous to a voltage-frequency converter and includes, as in FIG. 1, the measuring capacitor 100 of capacitance X, the reference capacitor 104 of capacitance $X_E$, the resistor 101 of high ohmic resistance R and the voltage comparator 102. On the other hand, the relaxation oscillator no longer comprises an impedance matching network as in FIG. 1, but rather an integrator 107. This latter is made up of an operational amplifier 1070 of a high gain equal to 2000 approximatively. The inverse input 1071 of the amplifier 1070 is connected to the common connection point 105a which is common with the resistor 101 and the second electrodes 1001, 1041 of the capacitors 100 and 104. The output terminal 1072 of the amplifier 1070 is connected to the resistor 1025 of inverse input 1024 of the operational amplifier 1020 which mainly makes up the voltage comparator 102 of the oscillator 10a. The output terminal 1072 is also connected to the first electrodes 1000 and 1041 of the capacitors 100 and 104, through the switching network 11a. As can be seen on FIG. 4, the screening conductor 106a is coaxial to the common connection wire 105a and surrounds the two electrodes of each of the capacitors 100 and 104. This screening conductor 106a is no longer neutralized by an impedance matching network, but is quite simply connected to the reference voltage or ground.

The switching circuit 11a comprises only two field effect transistor type static switches 110a and 112a. The transistor 110a has its control electrode controlled by the logic control signal which is transmitted on the wire $211_4$ from the digital circuit 2, so that the transistor 110a turns on during the measuring duration $\Delta t_X$ of the capacitance X. Similarly, the other transistor 112a has its control electrode controlled by the logic control signal which complements the previous one and is delivered on the wire $211_2$ from the digital circuit 2 so that transistor 112a turns on during the reference duration $\Delta t_E$ or the reference capacitance $X_E$. As in FIG. 1, the measuring and reference phase durations $\Delta t_X$ and $\Delta t_E$ are equal or in a predetermined ratio R. The collector of each transistor 110a or 112a is connected to the first electrode 1000 or 1040 of the respective capacitor 100 or 104. But in contrast to the switching network 11 where the emitters of the two analogous transistors 110 and 112 were alternately connected to the reference voltage, the emitters of the transistor 110a and 112a are alternately connected to the output terminal 1072 of the integrator 107 during the durations $\Delta t_X$ and $\Delta t_E$ respectively.

Following the above description, the relaxation oscillating means includes an integration circuit comprising the operational amplifier 1070 and having the resistor 101 and the capacitor 100 or 104 in dependence on the logic signal on wires $211_4$ or $211_2$ which controls the turned on and turned off conditions of the transistors 110a and 112a or the transistors 112a and 110a respectively.

Since operational amplifier 1070 has a high input impedance and a low output impedance and since its input terminal 1071 is substantially at the reference voltage, it makes its possible to inhibit interference capacitances between electrode 1041 of capacitor 104, the stationary electrode 1001 of the capacitor 100 and the inverse input 1071 of the amplifier 1070 on the one hand and the reference voltage on the other. Indeed, the voltage at inverse input 1071 being very small, i.e. substantially equal to the reference voltage, all the current crossing the load resistor 101 flows towards the second electrodes 1001 and 1041 one of which is undergoing a current loading proportional to RX or $RX_E$ when the associated transistor 110a or 112a turns on. Thus, the interference capacitances become negligible since they are divided by the gain of the operational amplifier 1070, and do not affect the measurement linearity especially when the physical quantity $G_X$ to be measured is porportional to the variable spacing between the electrodes of the capacitor 100 to be measured. Consequently, the interference charges flowing in the interference capacitances between the common connection point 105a and the coaxial screening conductor 106a which is connected to the reference voltage, are negligible when compared to the stored charge by the capacitance X or $X_E$. This contributes to increasing the measurement accuracy. The first electrode 1000 or 1040 of the capacitor 100 or 104 is subject however to the voltage variation controlled by the voltage comparator 102 when the associated transistor 110a or 112a turns on. The other capacitor 104 or 100 has its first electrode 1040 or 1000 un-charged due to the fact that the other transistor 112a or 110a turns off, and also produces no interference capacitance since the screening conductor 106a surrounds the electrodes of this capacitor entirely.

Furthermore, it will be noted, in accordance with the two embodiments shown in FIGS. 1 and 4, that the electric field prevailing between movable electrode 1000 and stationary electrode 1001 of the capacitor 100 to be measured, when adjusted, must be uniform regardless of the displacements of the movable electrode 1000 so that the edge-effects between the electrodes 1000, 1001 are reduced and do not affect the capacitance measurement accuracy. To this end, the screening surrounding the capacitor 100 to be measured having flat or cylindrical electrodes is shown schematically in FIGS. 5A and 5B and in FIGS. 6A and 6B respectively.

Figure 5A:
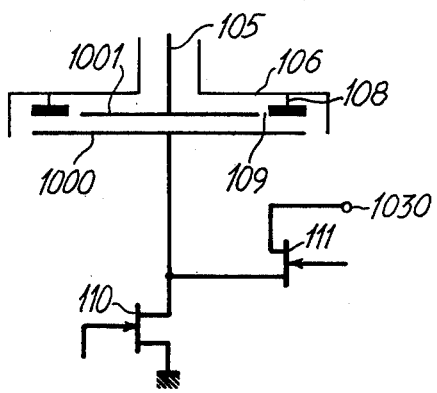
FIGS. 5A and 5B shown in detail an adjustable capacitor having flat electrodes in accordance with the first and second embodiments of the analog circuit.
Figure 5B:
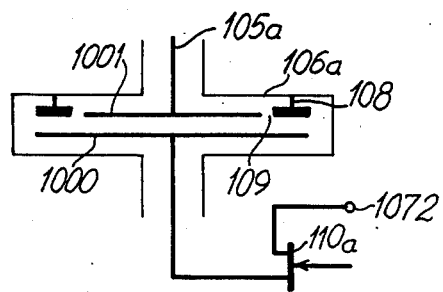
Figure 6A:
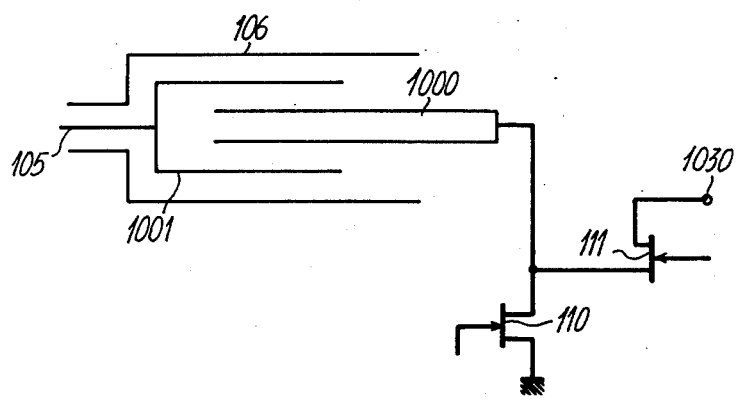
FIGS. 6A and 6B show in detail an adjustable capacitor having cylindrical electrodes in accordance with the first and second embodiments of the analog circuit.
Figure 6B:
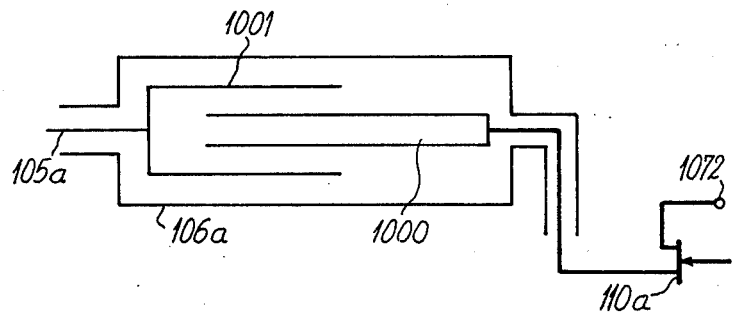

The structure of adjustable capacitor 1000 can be one of the known types, namely:

with flat electrodes and one movable electrode 1000 having a parallel or angular displacement to the stationary electrode 1001 as shown in FIGS. 5A and 5B; or with cylindrical electrodes and one movable electrode 1000 sliding inside the other 1001 as shown in FIGS. 6A and 6B, in accordance with the two embodiments referred to FIGS. 1 and 4.

According to the first type relating to the flat structure, the edge-effects at the ends of the electrodes have some effect on the measurement accuracy, whereas according the second type relating to the cylindrical structure, this effect is compensated at the ends of the electrodes.

To achieve this, in accordance with the invention, for an adjustable flat capacitor 100 such as that shown in FIGS. 5A and 5B in relation to the two embodiments of FIGS. 1 and 4, the stationary electrode 1001 is surrounded by a flat screening conductor ring 108 whose inside circumference is very close and coplanar to the electrode 1001 and whose outside circumference is parallel to and above that of the movable electrode 1000. The screening ring 108 is connected to the screening conductor 106 or 106a above the electrodes and as a result, maintains a voltage substantially equal to the applied voltage to the electrode 1001. Consequently, when the movable electrode 1000 moves perpendicularly or angularly to the stationary electrode 1001 in such a way that the variation of the physical quantity $G_X$ to be measured is proportional to the electrode spacing and thus inversely proportional to the capacitance X, then the electric field prevailing between the electrodes is substantially uniform and especially at the external section of the electrode 1001 indicated by 109 on FIGS. 5A and 5B. In this case, the physical quantity $G_X$ to be measured varies linearly with the load voltage applied to the capacitor 100, i.e. it varies strictly as the inverse of the capacitance of the capacitor to be measured.

Finally, it will be noted that the connections between the capacitors 100 and 104 are not restricted to these of FIGS. 1 and 4 for measuring a physical quantity dependent on a variable capacitance. Indeed, the structure of the switching network 11 or 11a can be adapted to the capacitor circuitry i.e. the sensors. Thus for example, during the measuring phase, the reference capacitor and the capacitor to be measured are connected in parallel to the reference voltage whereas during the reference phase only the reference capacitor is connected to the reference voltage; or else, during the measuring phase, the measuring capacitor is connected to the reference voltage whilst during the reference phase, the reference capacitor and the measuring capacitor to be measured are connected in parallel to the reference voltage. Lastly, the two capacitors can be connected in series during one of the phases as per an order analogous to that described above concerning these capacitors connected in parallel.

What we claim is:

1. A capacitance measuring device for measuring the capacitance X of a first capacitor by means of the comparison of the charge and discharge periods of a second capacitor having a calibrated reference capacitance $X_E$ with said first capacitor during two successive reference and measuring phases of a comparison cycle, said device comprising:

an oscillating circuit including one of said first and second capacitors and having an oscillation period proportional to the capacitance of said included capacitor and a high stability, switching means for connecting at the beginning of each of said reference and measuring phases said second and first capacitors in said oscillating circuit respectively, means for counting a predetermined number $N_E$ of pulses delivered from said oscillating circuit during said reference phase so as to define a determined duration of said reference phase and for counting a number $N_X$ of pulses delivered from said oscillating circuit during said measuring phase, the ratio of said oscillation pulse numbers $N_E$ and $N_X$ being inversely proportional to the ratio of said capacitances $X_E$, X of said second and first capacitors, timing means for generating pulses having at least a clock frequency, means for counting and down-counting said clock pulses during said reference and measuring phases respectively, means controlled by said counting means for changing the counting condition to the down-counting condition of said counting and down-counting means when the count of said counting means is equal to said predetermined number $N_E$ at the end of said reference phase, means controlled by said counting and down-counting means for stopping the counting of said counting means when the count of said counting and down-counting means is equal to zero at the end of said measuring phase so that the duration of said measuring phase is equal to or in a predetermined ratio R with said determined duration of said reference phase, means for computing a physical quantity proportional or inversely proportional to the value $(N_E X_E)/(R N_X)$ equal to said capacitance X of said first capacitor, and means for displaying the value of said physical quantity.

2. A capacitance measuring device according to claim 1, comprising means for dividing or multiplying said clock frequency by said predetermined ratio R during one of said measuring and reference phases so that said counting and down-counting means counts clock pulses at a first frequency during said reference phase and down-counts clock pulses at a second frequency in said predetermined ratio R with said first frequency during said measuring phase.

3. A capacitance measuring device for measuring the capacitance X of a first capacitor by means of the comparison of the charge and discharge periods of a second capacitor having a calibrated reference capacitor $X_E$ and said first capacitor during two successive reference and measuring phases of a comparison cycle, said device comprising:
  a relaxation oscillator including one of said first and second capacitors and having an oscillation period proportional to the capacitance of said included capacitor and a high stability,
  said relaxation oscillator also comprising means for neutrelizing said first and second capacitors during said reference and measuring phases respectively,
  switching means for including at the beginning of each of said reference and measuring phases said second and first capacitors in said relaxation oscillator respectively,
  means for counting a predetermined number $N_E$ of pulses delivered from said relaxation oscillator during said reference phase so as to define a determined duration of said reference phase and for counting a number $N_X$ of pulses delivered from said relaxation oscillator during said measuring phase, the ratio of said oscillation pulse numbers $N_E$ and $N_X$ being inversely proportional to the ratio of said capacitances $X_E$, X of said second and first capacitors,
  timing means for generating pulses having at least a clock frequency,
  means for counting and down-counting said clock pulses during said reference and measuring phases respectively,
  means controlled by said counting means for changing the counting condition to the down-counting condition of said counting and down-counting means when the count of said counting means is equal to said predetermined number $N_E$ at the end of said reference phase,
  means controlled by said counting and down-counting means for stopping the counting of said counting means when the count of said counting and down-counting means is equal to zero at the end of said measuring phase so that the duration of said measuring phase is equal to or in a predetermined ratio R with said determined duration of said reference phase,
  means for computing a physical quantity proportional or inversely proportional to the value $(N_E X_E)/(R N_X)$ equal to said capacitance X of said first capacitor, and
  means for displaying the value of said physical quantity.

4. A capacitance measuring device according to claim 3, in which
  said neutralising means comprises impedance matching means having a amplification factor equal to unity,
  an output terminal connected to the voltage comparating means of said relaxation oscillator and alternatively connected under the control of said switching means to first electrodes of said second and first capacitors during said measuring phase and reference phases respectively, and
  an input terminal connected to the second electrodes of said first and second capacitors and the resistor of said relaxation oscillator.

5. A capacitance measuring device according to claim 4, in which said neutralizing means comprises a screening conductor connected to said output terminal of said impedance matching means and surrounding coaxially said second electrodes of said first and second capacitors and the connection wires common to said input terminal of said impedance matching means, said resistor of said relaxation oscillator and said second electrodes of said first and second capacitors.

6. A capacitance measuring device for measuring the capacitance X of a first capacitor by means of the comparison of the charge and discharge periods of a second capacitor having a calibrated reference capacitance $X_E$ and said first capacitor during two successive reference and measuring phases of a comparison cycle, said device comprising:
  a relaxation oscillator including one of said first and second capacitors and having an oscillation period proportional to the capacitance of said included capacitor and a high stability,
  said relaxation oscillator also comprising means for inhibiting the effects of interference capacitances between the ground referenced voltage and the electrodes of said first and second capacitors,
  switching means for including at the beginning of each of said reference and measuring phases said second and first capacitors in said relaxation oscillator respectively,
  means for counting a predetermined number $N_E$ of pulses delivered from said relaxation oscillator during said reference phase so as to define a determined duration of said reference phase and for counting a number $N_X$ of pulses delivered from said relaxation oscillator during said measuring phase, the ratio of said oscillation pulse numbers $N_E$ and $N_X$ being inversely proportional to the ratio of said capacitances $X_E$, X of said second and first capacitors,
  timing means for generating pulses having at least a clock frequency,
  means for counting and down-counting said clock pulses during said reference and measuring phases respectively,
  means controlled by said counting means for changing the counting condition to the down-counting condition of said counting and down-counting means when the count of said counting means is equal to said predetermined number $N_E$ at the end of said reference phase,
  means controlled by said counting and down-counting means for stopping the counting of said counting means when the count of said counting and down-counting means is equal to zero at the end of said measuring phase so that the duration of said measuring phase is equal to or in a predetermined ratio R with said determined duration of said reference phase,
  means for computing a physical quantity proportional or inversely proportional to the value $(N_E X_E)/(R N_X)$ equal to said capacitance X of said first capacitor, and
  means for displaying the value of said physical quantity.

7. A capacitance measuring device according to claim 6, in which said inhibiting means comprises integrating means having a high amplification factor,
an output terminal connected to the voltage comparating means of said relaxation oscillator and alternatively connected under the control of said switching means to first electrodes of said second and first capacitor during said reference and measuring phases respectively, and
an input terminal connected to the second electrodes of said first and second capacitors and the resistors of said relaxation oscillator.

8. A capacitance measuring device according to claim 7, in which said inhibiting means included a screening conductor connected to said ground referenced voltage and surrounding coaxially at least said second electrodes of said first and second capacitors and the connection wires common to said input terminal of said integrating means, said resistor of said relaxation oscillator and said second electrodes of said first and second capacitors.

9. A capacitance measuring device according to claim 8, in which said first capacitor is an adjustable capacitor, the variation of said physical quantity is inversely proportional to the variation of said capacitance of said adjustable capacitor, and said adjustable capacitor has flat electrodes, said second electrode of which being a stationnary electrode which is surrounded by a screening conductor ring coplanar to said stationnary electrode and connected to said screening conductor, the electric field between said first stationnary electrode and the second movable electrode of said first capacitor and said screening conductor ring being substantially uniform for high variations of spacing between said stationnary and movable electrodes.

10. A capacitance measuring device according to claim 9, in which said movable electrode is movable angularly with respect to said stationnary electrode.

* * * * *